US006791189B2

(12) United States Patent
Pearson et al.

(10) Patent No.: US 6,791,189 B2
(45) Date of Patent: Sep. 14, 2004

(54) EPOXY WASHER FOR RETENTION OF INVERTED SMT COMPONENTS

(75) Inventors: Tom E. Pearson, Beaverton, OR (US); Christopher D. Combs, Portland, OR (US); Arjang Fartash, Corvallis, OR (US); Raiyomand Aspandiar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/313,238

(22) Filed: Dec. 5, 2002

(65) Prior Publication Data

US 2003/0111259 A1 Jun. 19, 2003

Related U.S. Application Data

(62) Division of application No. 10/020,859, filed on Dec. 13, 2001, now Pat. No. 6,691,407.

(51) Int. Cl.⁷ ............................................. H01L 23/48
(52) U.S. Cl. .................... 257/773; 257/783; 156/330
(58) Field of Search .................. 29/832, 833, 872; 156/306.6, 306.9, 321, 330; 257/734, 773, 774, 782, 783; 438/106, 118, 119

(56) References Cited

U.S. PATENT DOCUMENTS

| 4,573,105 A |   | 2/1986  | Beldavs                  |
|-------------|---|---------|--------------------------|
| 4,950,173 A | * | 8/1990  | Minemura et al. ... 439/82 |
| 5,155,904 A | * | 10/1992 | Majd ................. 29/837 |
| 5,296,063 A |   | 3/1994  | Yamamura et al.          |
| 5,848,466 A | * | 12/1998 | Viza et al. ........... 29/840 |
| 6,190,940 B1 | * | 2/2001 | DeFelice et al. ....... 438/106 |
| 6,260,264 B1 |   | 7/2001 | Chen et al.              |
| 6,573,122 B2 | * | 6/2003 | Standing ............ 438/118 |
| 6,691,407 B2 | * | 2/2004 | Pearson et al. ....... 29/840 |

FOREIGN PATENT DOCUMENTS

EP        1022774 A2 *  7/2000  ........... H01L/21/60

OTHER PUBLICATIONS

Patent Abstracts of Japan, vol. 1997, No. 05, May, 30, 1997 & JP 09 008446A (Matsushita Electric Ind. Co. Ltd.), Jan. 10, 1997 Abstract.

* cited by examiner

Primary Examiner—Alonzo Chamliss
(74) Attorney, Agent, or Firm—Blakely, Sokoloff, Taylor & Zafman LLP

(57) ABSTRACT

An apparatus to retain an assembled component on one side of a double-sided printed circuit board during reflow of other components subsequently positioned onto an opposite side of the double-sided printed circuit board and methods for manufacturing and using the same. Being formed from an epoxy material, the retainer is configured to be coupled with a component, which is then positioned onto a printed circuit board. During a subsequent solder reflow stage, an ambient temperature surrounding the printed circuit board increases, and the epoxy material is configured to enter a semi-liquid state, flowing onto, and adhering with, the printed circuit board. Upon reaching a typical solder reflow temperature, the liquefied epoxy material is configured to cure or harden, adhesively coupling the component with the printed circuit board. Thereby, the component is inhibited from separating from the printed circuit board when the printed circuit board is subsequently inverted, populated, and reflowed.

18 Claims, 4 Drawing Sheets

EPOXY WASHER FOR RETENTION OF INVERTED SMT COMPONENTS

This is a Divisional Application of Ser. No. 10/020,859 filed Dec. 13, 2001, now U.S. Pat. No. 6,691,407.

FIELD OF THE INVENTION

The present invention relates generally to printed circuit board assembly and, more particularly, to an apparatus and method to retain an assembled component on one side of a double-sided printed circuit board during reflow of other components subsequently positioned onto an opposite side of the double-sided printed circuit board.

BACKGROUND OF THE INVENTION

Printed circuit boards (PCBs) generally comprise a composite of organic and inorganic materials with external and internal metal traces, permitting assembled electronic components to be mechanically supported and electrically connected. A typical printed circuit board includes one or more metal layers, such as routing and/or plane layers, and one or more insulation layers. Each of the insulation layers is disposed substantially between successive metal layers with each outer layer of the printed circuit board comprising one of the metal layers. Each of the metal routing layers is patterned to transfer signals between assembled electronic components, and each of the metal plane layers, such as a power plane layer or a ground plane layer, is designed to distribute power or ground, respectively, throughout the printed circuit board.

Electronic components are assembled onto at least one of the outer metal layers of the typical printed circuit board. On a single-sided printed circuit board, for example, electronic components are assembled on only one of the outer metal layers, referred to as the primary side of the printed circuit board. The opposite side of such a printed circuit board is called the secondary side. After the electrical components have been positioned onto the primary side via, for example, a pick-and-place machine (not shown), the single-sided printed circuit board typically undergoes a single soldering stage. Alternatively, electronic components can be assembled onto both the primary side and the secondary side of a double-sided printed circuit board. To assemble electrical components onto both sides, double-sided printed circuit boards must typically undergo multiple soldering stages.

Today, a significant number of electrical components are surface mounted to printed circuit boards. The driving force behind the use of surface-mount technology (SMT) components is reduced package size, improved utilization of printed circuit board real estate, and simplified assembly. Surface-mount components are positioned onto metal pads or lands, which are formed on the outer metal layers of the printed circuit board, by applying solder paste to the relevant lands before positioning the surface-mount components. Comprising solder and flux, the solder paste liquefies during a manufacturing stage called solder reflow (or more simply reflow), and the surface tension of the liquefied solder enables the surface-mount components to align with, and to couple with, the relevant lands. Thus, when the solder cools and solidifies, the surface-mount components each are assembled onto the printed circuit board.

To more efficiently utilize printed circuit board real estate, double-sided printed circuit boards are used with surface-mount components assembled onto both the primary side and the secondary side of the printed circuit board. On a double-sided printed circuit board, surface-mount components first are assembled, i.e. positioned and reflowed, on an upward-facing side, such as the primary side, of the printed circuit board. The double-sided printed circuit board then is flipped over such that the opposite side, such as the secondary side, faces upwardly, and additional surface-mount components are positioned onto the secondary side. After the additional surface-mount components have been positioned, the double-sided printed circuit board undergoes a second reflow stage to liquefy the solder on the upward-facing secondary side. During the second reflow stage, however, the entire double-sided printed circuit board is heated, and the solder on the primary side also liquefies with the surface-mount components assembled onto the primary side facing downwardly in opposition of gravity.

Unlike through-hole components, most surface-mount components do not include any retaining devices, such as through-hole conductive pins or locating posts, to substantially maintain component placement during the second reflow stage. Although adequate to maintain component placement on the upward-facing secondary side of the double-sided printed circuit board, the surface tension of the liquefied solder during the second reflow stage generally is insufficient to maintain component placement for heavier surface-mount components previously assembled onto the downward-facing primary side. Due to the effects of gravity, one or more of the surface-mount components previously assembled onto the downward-facing primary side can separate from or become misaligned with the relevant lands when the solder again liquefies during the second reflow stage. For example, the inverted surface-mount components during the second reflow stage can separate from the double-sided printed circuit board and/or undergo a translation or a rotation. As size and pin-count have increased in recent years, surface-mount components, such as ball-grid arrays (BGAs) and connectors, have increased in mass and, therefore, are more prone to separate from, or become misaligned with, the double-sided printed circuit board when inverted and reflowed. To retain these larger surface-mount components, adhesives presently are applied to the double-sided printed circuit board before the surface-mount components are positioned. Automatic adhesive application, however, requires additional equipment, which must be purchased and maintained; whereas, manual application of the adhesive results in unpredictable quality and increased labor expenses.

In view of the foregoing, it is believed that a need exists for an inexpensive apparatus to retain inverted components on double-sided printed circuit board assemblies during subsequent reflow stages that overcomes the aforementioned obstacles, limitations, and deficiencies in the manufacture of double-sided printed circuit board assemblies.

DETAILED DESCRIPTION OF THE PREFERRED EMBODIMENTS

Since assembled surface-mount components can separate from, or become misaligned with, a double-sided printed circuit board when subsequently inverted and reflowed under present manufacturing techniques, an inexpensive apparatus to retain the assembled surface-mount components during subsequent reflow stages can prove much more desirable and provide a basis for a wide range of printed circuit board assembly applications, such as personal computer products. This result can be achieved, according to one embodiment of the present invention, by employing a retainer 100 for double-sided printed circuit board assemblies as shown in FIGS. 1a and 1b.

The retainer 100 is formed from a pre-cured epoxy material (not shown). Although preferably comprising a thermally-activated, single-part polymer and/or resin, the epoxy material can comprise any type of epoxy material. The epoxy material is configured to transition from a solid state to a semi-liquid state at a liquefaction temperature that is less than or substantially equal to a melting point of solder and/or typical solder reflow temperatures, which range substantially between 180° C. and 240° C. The liquefaction temperature of the epoxy material preferably is substantially between 100° C. and 150° C. Including a curing agent, a hardening agent, and/or a curing accelerator, the epoxy material also is configured to cure or harden at a curing temperature that is substantially equal to the typical solder reflow temperature range used in SMT manufacturing, preferably at approximately 210° C. Once cured, the epoxy material of the retainer 100 does not again transition into the semi-liquid state when exposed to temperatures greater than or substantially equal to the liquefaction temperature. The epoxy material preferably is configured to remain functionally stable and resist chemical decomposition when exposed to temperatures that are much higher than the melting point of solder. For example, the one component, thermally-conductive silicone produced as part number MT-220 by Thermoset, Lord Chemical Products, of Indianapolis, Ind., offers superior adhesive strength in combination with a very high thermal conductivity. This thermally-conductive silicon transitions into the semi-liquid state at approximately 125° C., which is less than the typical solder reflow temperatures, and cures in thirty minutes at a curing temperature of 150° C. Having a curing time that is halved with each 10° C. increase in temperature, this thermally conductive silicone is configured to cure in less than one minute at the typical solder reflow temperatures. For example, at a temperature of 200° C., the curing time of this thermally conductive silicone is approximately equal to fifty-six seconds. Those skilled in the art will appreciate that the curing time of the epoxy material can be further adjusted through the use of different curing agents or accelerators and/or by changing a heating profile of the reflow oven.

Figure 1A:
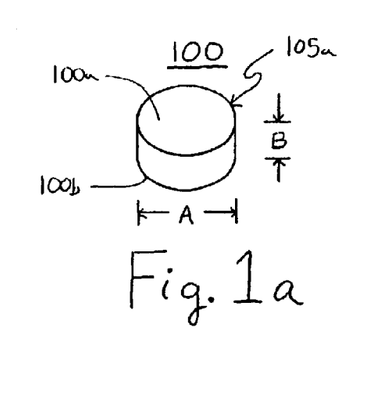
FIG. 1a is an illustration of one preferred embodiment of a retainer to substantially maintain the placement of components assembled onto a printed circuit board in accordance with the present invention.
Figure 1B:
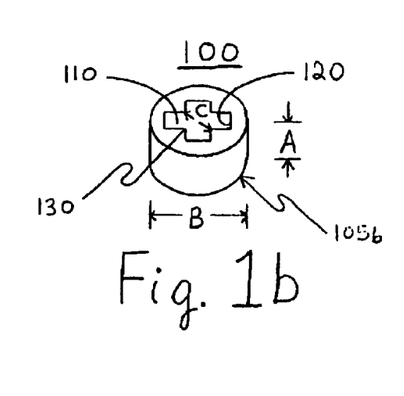
FIG. 1b is an illustration of another preferred embodiment of a retainer to substantially maintain the placement of components assembled onto a printed circuit board in accordance with the present invention.

The retainer 100 comprises an adhesive body that can be formed with any size and shape, such as a substantially cylindrical body as shown in FIGS. 1a and 1b, by any manufacturing process known in the art, such as stamping or molding. As illustrated, the retainer 100 has a thickness A and a cross-section B, both of which can be of any suitable dimension. The retainer 100 includes a proximal end region 100a and an oppositely disposed distal end region 100b. The retainer 100 can be formed as a substantially-solid body 105a, as shown in FIG. 1a, or as a permeable body 105b, as illustrated in FIG. 1b. The permeable body 105b can be formed with any size and shape, such as a tube, a washer, a toroid, or a hollow cylinder, and includes one or more internal surfaces 120 that define a channel 110. The channel 110 and the internal surfaces 120 each are suitably formed by any manufacturing process known in the art. In the illustrated embodiment, the channel 110 is substantially centrally formed in the retainer 100 and is formed substantially completely through the retainer 100. Stated somewhat differently, the proximal end region 100a and the distal end region 100b each are configured to communicate with, and to be coupled with, the channel 110. Alternatively, or additionally, the channel 110 may be off-center and/or formed only partially through the retainer 100. Being configured to be formed with any size and dimension, a cross-section C of the channel 110 preferably is formed substantially in the shape of a cross as shown in FIG. 1b.

Figure 2:
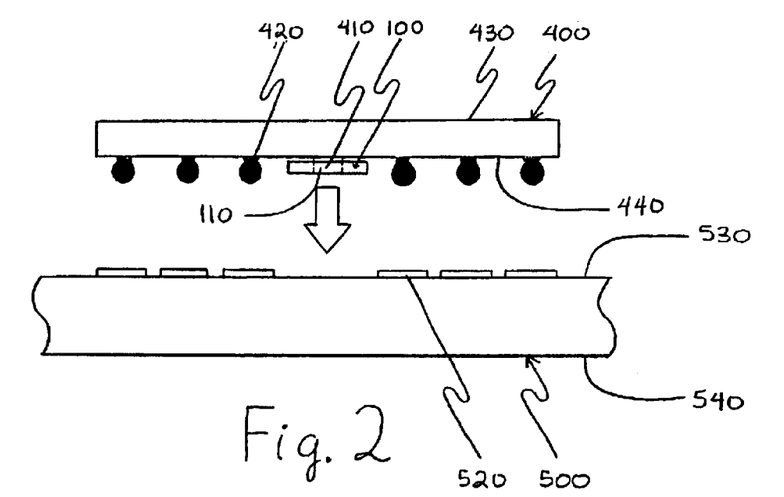
FIG. 2 illustrates the retainer of FIG. 1b coupled with a component prior to placement onto the double-sided printed circuit board.
Figure 6:
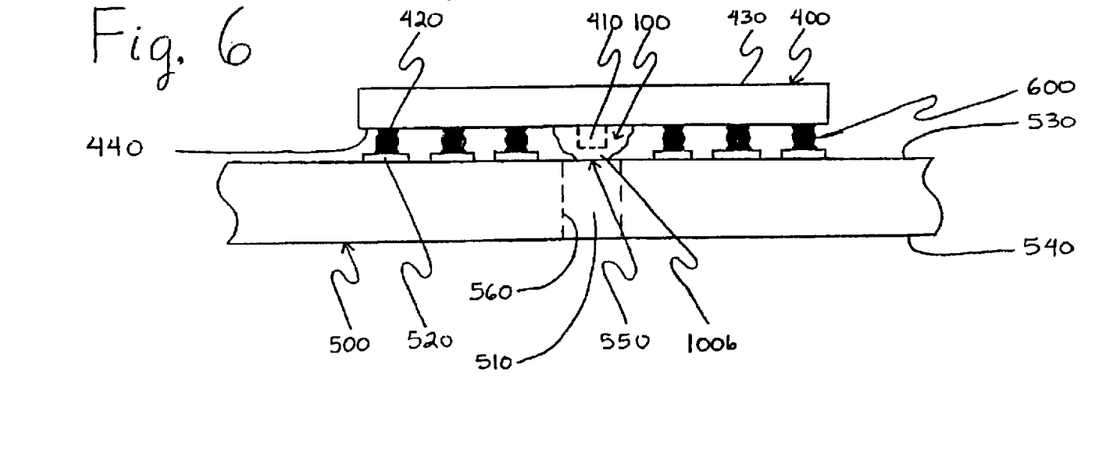
FIG. 6 illustrates the retainer of FIG. 2 after the component has been assembled onto the double-sided printed circuit board.

Turning to FIG. 2, the retainer 100 is configured to be coupled with a component 400 via, for example, the proximal end region 100a. The component 400 can comprise any type of electrical and/or electronic component, such as an integrated circuit, a socket, or a connector. Although the component 400 preferably is a surface-mount component manufactured in, for example, a ball-grid array (BGA), a quad flat pack (QFP), or a thin small outline package (TSOP), it will be appreciated that the retainer 100 is compatible with components 400 manufactured in any type of package, including through-hole packages. The component 400 includes one or more electrical connections 420, such as leads and/or pads, which are electrically isolated and supported by a component package 430. The component package 430 can be formed from any type of electronic packaging material, such as plastic, ceramic, or metal, that is well-known in the art. The electrical connections 420 each are configured to couple the component 400 with one or more relevant mounting surfaces 520, such as solder pads or lands, on one side, such as a primary side 530 or a secondary side 540, of the double-sided printed circuit board 500. Each of the electrical connections 420 is coupled with the one or more relevant mounting surfaces 520 via a solder connection 600 as shown in FIG. 6.

The retainer 100 can be positioned onto the component package 430 of the component 400 in any manner known in the relevant art and preferably is substantially centrally positioned such that a mass or size of the component 400 is substantially equally distributed about the retainer 100. The retainer 100 can be coupled with the component 400 at any time prior to assembly onto the double-sided printed circuit board 500 and by any manner known in the relevant art, such as via an adhesive. For example, the proximal end region 100a, being formed from the epoxy material, can be configured to adhere with the component package 430. The retainer 100 also can be coupled with the component 400 via a coupling member, more specifically a post 410 as shown in FIG. 2. The post 410 is coupled with, and extends from, the component package 430 of the component 400. The post 410 preferably is substantially centrally positioned such that a mass or size of the component 400 is substantially equally distributed about the post 410 or the retainer 100. The post 410 can be formed from any type of material, such as plastic, ceramic, or metal, that is well-known in the art. Like the electronic packaging material of the component package 430, the material forming the post 410 is configured to remain chemically and functionally stable when exposed to temperatures that are much higher than the typical solder reflow temperatures.

The post 410 is preferably coupled with, or formed onto, the component package 430 before the component 400 has been assembled onto the double-sided printed circuit board 500. More preferably, the post is coupled with, or formed onto, the component package 430 during pre-assembly preparation of the component 400 or when the component 400 is being produced, for example, during a separate manufacturing stage. The post 410 can be coupled with the component package 430 in any manner known in the art, including via an adhesive, clamps, and/or fasteners. The post 410 can extend from any portion of the component package 430 and preferably is configured to extend from a surface 440 of the component package 430 that is substantially adjacent to the double-sided printed circuit board 500 when the component 400 is positioned and assembled.

Figure 3:
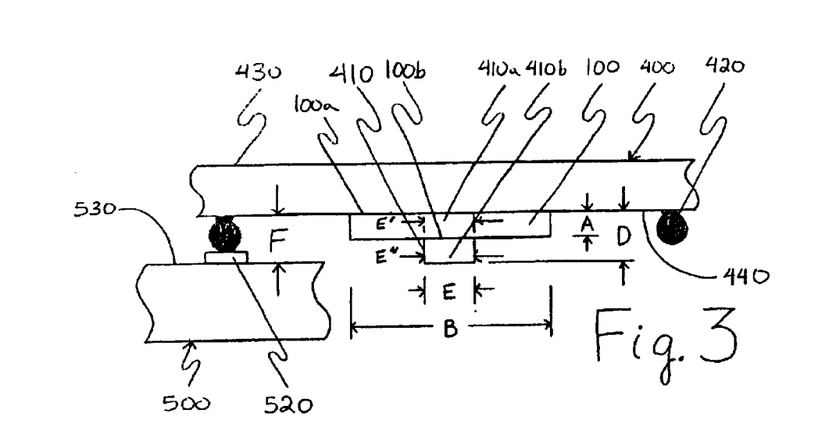
FIG. 3 is a detailed view of one preferred coupling arrangement of the retainer with the component of FIG. 2.

The post 410 can comprise any type of extension and can be formed with any size and shape. The size and shape of the post 410 depend upon the size and shape of the retainer 100. For example, the post 410 can have a length D and a cross-section E as illustrated in FIG. 3. The length D of the post 410 can comprise any length and can be greater than, substantially equal to, or less than the thickness A of the retainer 100. To permit the component 400 to be properly assembled, the thickness A of the retainer 100 preferably is less than a pre-reflow standoff distance F between the surface 440 and a relevant side, such as the primary side 530, of the double-sided printed circuit board 500. When the pre-reflow standoff distance F is substantially equal to 1.8 mm, for example, the thickness A of the retainer 100 preferably is substantially equal to 1 mm, and the cross-section B preferably has a width that is substantially equal to 5 mm. The thickness A of the retainer 100 preferably does not exceed the pre-reflow standoff distance F to permit the component 400 to be properly positioned and/or assembled onto the relevant mounting surfaces 520. The length D of the post 410 can be less than or substantially equal to the pre-reflow standoff distance F. The cross-section E of the post 410 can be of any size and shape and preferably is less than the cross-section B of the retainer 100. The retainer 100 preferably is configured to provide a band of epoxy material surrounding the cross-section E of the post 410, in whole or in part. Stated somewhat differently, the epoxy material of the retainer 100 can be configured to surround, substantially fully or partially, the cross-section E of the post 410. Although the post 410 can be formed into any regular or irregular shape, the post 410 preferably is formed substantially as a cylindrical peg. The post 410 also has a proximal end region 410a and a distal end region 410b and is coupled with the component package 430 via the proximal end region 410a. The cross-section E of the post 410 preferably is substantially uniform; however, a cross-section E' of the proximal end region 410a can be greater than, substantially equal to, or less than a cross-section E" of the distal end region 410b.

Returning to FIG. 2, the retainer 100 is configured to receive the distal end region 410b of the post 410 via the channel 110. The channel 110 is configured to receive the distal end region 410b, substantially in whole or in part, and can be formed in the epoxy material at any time prior to assembly of the component 400 onto the double-sided printed circuit board 500. For example, the channel 110 can be preformed in the epoxy material, as shown in FIG. 1b, and/or can be formed in the epoxy material by the distal end region 410b as the distal end region 410b is being received. The cross-section C of the channel 110 can comprise any size and width and can be greater than, substantially equal to, or less than the cross-section E of the post 410. The distal end region 410b can be disposed substantially within the retainer 100, such as when the thickness A of the retainer 100 exceeds the length D of the post 410, or can extend through the retainer 100, such as when the length D is greater than the thickness A. Stated somewhat differently, the channel 110 is configured to receive the distal end region 410b of the post 410, substantially in whole or in part. The channel 110 further is configured to continue to receive the post 410 until the proximal end region 100a of the retainer 100 becomes substantially adjacent to, or comes into contact with, the surface 440 of the component package 430 as shown in FIG. 3. When the proximal end region 100a is substantially adjacent to, or in contact with, the surface 440, the retainer 100 preferably is substantially flat. An automated insertion tool or machine (not shown) can be used to position the retainer 100 onto the component 400 by, for example, holding the retainer 100 substantially flat while pushing the retainer 100 onto the post 410.

When the distal end region 410b is received by the channel 110, at least one of the internal surfaces 120 (shown in FIG. 1b) that define the channel 110 is configured to engage the distal end region 410b. The internal surfaces 120 each can engage the distal end region 410b in any manner, such as frictionally or adhesively. For example, if formed in the retainer 100 as the distal end region 410b is being received, the channel 110 can have a cross-section C that substantially conforms with the cross-section E" of the distal end region 410b. Each of the internal surfaces 120 thereby is substantially configured to engage the distal end region 410b. Alternatively, or additionally, the channel 110 can be preformed in the retainer 100 as was previously discussed in more detail above. If the cross-section C is less than or substantially equal to the cross-section E" of the distal end region 410b, the preformed channel 110 is configured to substantially conform with and engage the distal end region 410b. The channel 100 further can include one or more engaging members 130 (shown in FIG. 1b) that extend into the channel 110. Being formed, or coupled with, one or more of the internal surfaces 120, the engaging members 130 each can be formed with any size and shape and extend, preferably substantially radially, into the channel 110 from one or more of the internal surfaces 120. If the cross-section C generally exceeds the cross-section E" of the distal end region 410b, the distal end region 410b can be received within the channel 110 and engaged by one or more of the engaging members 130. For example, when the cross-section E" of the distal end region 410b has a width of substantially 2.3 mm, opposing engaging members 130 can be separated by a radial distance of approximately 2.2 mm. The cross-section E" of the distal end region 410b preferably is substantially uniform to facilitate engagement with the channel 110.

Figure 4:
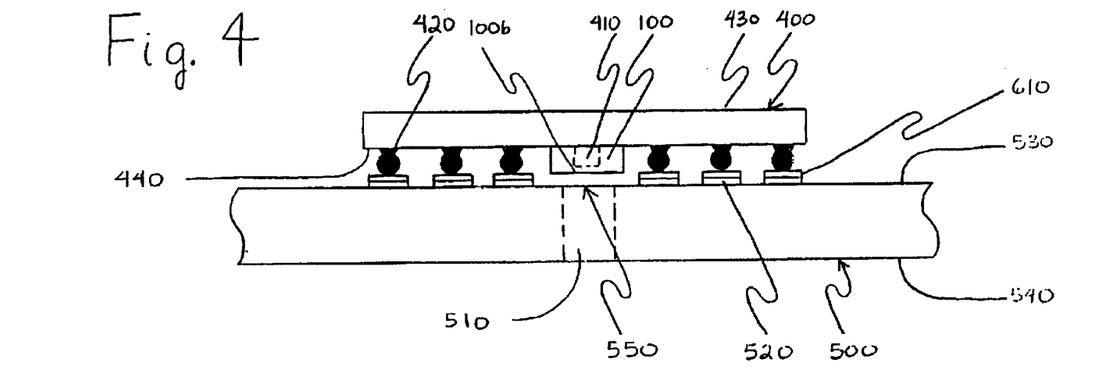
FIG. 4 illustrates the retainer of FIG. 2 before the component has been assembled onto the double-sided printed circuit board.

Upon being coupled with the retainer 100, the component 400 is positioned onto the one or more relevant mounting surfaces 520 on one side, such as, for example, the primary side 530, of the double-sided printed circuit board 500 as shown in FIG. 4. The primary side 530 is a side of the double-sided printed circuit board that is first populated and reflowed; whereas, the secondary side 540 is opposite the primary side 530, being populated and reflowed after the primary side 530. The component 400 can be positioned onto the primary side 530 by any manner known in the art, such as a pick-and-place machine (not shown). Additional components (not shown) also can be positioned onto one or more relevant mounting surfaces (not shown) on the primary side 530 along with the component 400 by any manner known in the art. The component 400 preferably is positioned onto the primary side 530 in the same manner that is used to position the additional components, if any. If solder reflow is to be used to assemble the component 400 and the additional components, for example, solder paste 610 is applied to each relevant mounting surface 520 for the component 400 and each relevant mounting surface for the additional components prior to placement. When the component 400 is properly positioned, the retainer 100 preferably is configured to be substantially in axial alignment with, and to extend substantially toward, a coupling region 550 of the double-sided printed circuit board 500. The coupling region 550 is formed on the primary side 530 of the double-sided printed circuit board 500 and defines a target region for adhesively coupling the double-sided printed circuit board 500 with the epoxy material of the distal end region 100*b*. For purposes of illustration, the component 400 is shown and described as being positioned onto the primary side 530; however, it will be appreciated that the component 400 can be positioned onto either side of the double-sided printed circuit board 500, including the secondary side 540.

Figure 5:
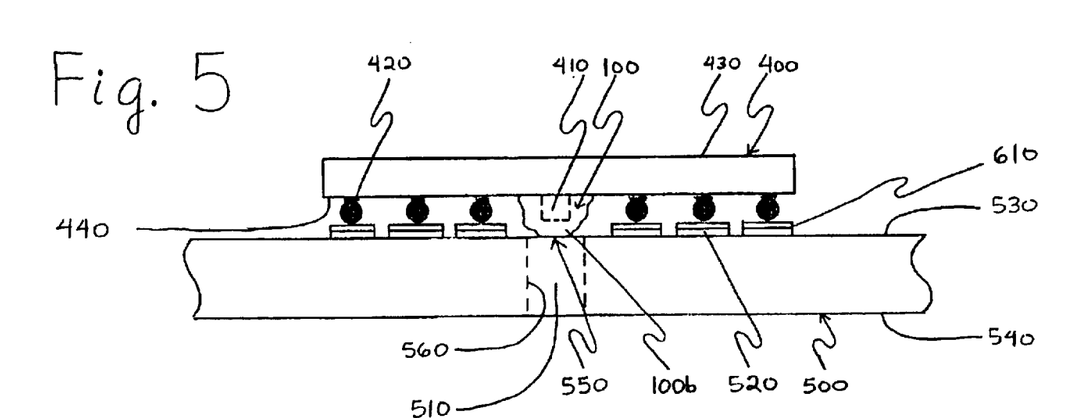
FIG. 5 illustrates the retainer of FIG. 2 while the component is being assembled onto the double-sided printed circuit board.

Once positioned onto the primary side 530, the component 400 and the additional components, if any, are held in place via, for example, the solder paste 610 and/or gravity and subsequently are assembled onto the primary side 530. The distal end region 100*b* extends substantially toward the coupling region 550. The component 400 and the additional components can be assembled onto the primary side 530 via any manner known in the relevant art, including wave soldering, hand soldering, convection reflow, and/or infrared (IR) reflow. During convection reflow, for example, the double-sided printed circuit board 500, along with the component 400, the retainer 100, and the additional components, begins to heat. The ambient temperature surrounding the double-sided printed circuit board 500 increases from room temperature and approaches the typical solder reflow temperature at which the solder paste 610 can liquefy. Being formed from the epoxy material with the liquefaction temperature that is less than or substantially equal to the typical solder reflow temperatures, the retainer 100 is configured to transition from the solid state to the semi-liquid state before or as the solder paste 610 liquefies as shown in FIG. 5. Upon transitioning into the semi-liquid state, the liquefied epoxy material of the distal end region 100*b* is configured to viscously flow via, for example, gravity substantially toward and onto the coupling region 550. The coupling region 550 is configured to receive, and adhere with, the liquefied epoxy material of the distal end region 100*b*. Stated somewhat differently, while remaining coupled with the component 400, the liquefied epoxy material of the retainer 100 is configured to flow onto and adhere with the coupling region 550 as shown in FIG. 5, adhesively coupling the component 400 with the double-sided printed circuit board 500.

The coupling region 550 is configured to receive and adhesively couple with the liquefied epoxy material flowing from the retainer 100 and, when the component 400 is positioned onto the primary side 530, is substantially axially aligned with the distal end region 100*b*. Preferably excluding any components and/or any exposed metal, such as the relevant mounting surfaces 520, the coupling region 550 can be formed with any size and shape on the primary side 530. Stated somewhat differently, the coupling region 550 can encompass an area of the primary side 530 that is greater than, substantially equal to, or less than the cross-section B of the retainer 100. The coupling region 550 preferably is configured to inhibit the liquefied epoxy material from extending or flowing beyond the coupling region 550. If desirable, the coupling region 550 can include an opening 510 that is formed in the double-sided printed circuit board 500 and that is defined by one or more inner surfaces 560. Being configured to receive some or all of the liquefied epoxy material flowing from distal end region 100*b*, the opening 510 is configured to provide additional adhesion surface area for the retainer 100 and to further confine the liquefied epoxy material. The opening 510 can be formed with any size and can comprise any type of opening, such as a via and/or a plated or non-plated through-hole. The opening 510 extends, substantially completely or partially, through the double-sided printed circuit board 500 and can be formed with any size, preferably being sized to confine the liquefied epoxy material from extending or flowing beyond the coupling region 550. The coupling region 550 and/or the inner surfaces 560 defining the opening 510 each can be roughened to increase the adhesion between the liquefied epoxy material and the double-sided printed circuit board 500 and, as a result, to further confine the liquefied epoxy material. Any manner known in the art can be used to roughen the coupling region 550 and/or the inner surfaces 560, including sandblasting or sandpaper. Further, one or more non-welling regions (not shown) can be defined on the primary side 530 to inhibit the liquefied epoxy material from adhering to the double-sided printed circuit board 500 outside of the coupling region 550. The coupling region 550 preferably is bounded by the non-welling regions.

As the ambient temperature approaches the typical solder reflow temperature, the solder paste 610 begins to liquefy. The liquefied epoxy material, being in the semi-liquid state, is configured to comply as a surface tension of the liquefied solder paste 610 enables the component 400 to substantially align with, and to couple with, the relevant mounting surfaces 520 on the primary side 530 as shown in FIG. 6. Once the component 400 is substantially aligned with the relevant mounting surfaces 520 on the primary side 530, the liquefied solder paste 610 forms the solder connections 600, coupling each of the electrical connections 420 with the one or more relevant mounting surfaces 520. As convection reflow continues, the ambient temperature remains substantially at or above the typical solder reflow temperature, which substantially corresponds with the curing temperature of the epoxy material of the retainer 100. When the ambient temperature is greater than or substantially equal to the curing temperature, the liquefied epoxy material of the retainer 100 cures in the shape produced in the semi-liquid state. By adhesively coupling the double-sided printed circuit board 500 with the component 400, the cured retainer 100 is configured to substantially maintain the proper position of the component 400 even as the solder connections 600 remain liquefied during convection reflow. After convection reflow, the solder connections 600 cool and solidify, and the component 400 is properly assembled onto the double-sided printed circuit board 500.

After the component 400 and the additional components are assembled onto the primary side 530, the double-sided printed circuit board 500 can be inverted to facilitate the positioning of one or more other components (not shown) onto the secondary side 540. The other components each can be positioned onto one or more relevant mounting surfaces (not shown) on the secondary side 540 by any manner known in the art, such as a pick-and-place machine (not shown), as was previously discussed in more detail above. For example, solder paste (not shown) can be applied to each of the relevant mounting surfaces on the secondary side 530, and the other components can be positioned onto the relevant mounting surfaces and held in place by the solder paste and/or gravity. Once positioned, the other components are assembled onto the secondary side 540 by any manner known in the art, such as a second convection reflow stage that is substantially similar to the convection reflow stage that was previously discussed in more detail above. During the second convection reflow stage, the double-sided printed circuit board 500, along with the inverted component 400, the retainer 100, and the other components, begins to heat. To liquefy the solder paste associated with the other components, for example, the ambient temperature surrounding the double-sided printed circuit board 500 approaches the typical solder reflow temperature at which some or all of the solder connections 600 of the inverted component 400 also can liquefy.

Being formed from the cured epoxy material, which can withstand decomposition and/or remain functionally stable at temperatures exceeding the typical solder reflow temperatures, the retainer 100 remains functionally stable during the second convection reflow stage. The use of the cured epoxy material inhibits the retainer 100 from deforming or softening due to heat exposure, substantially maintaining the position of the inverted component 400. The retainer 100 is configured to continue to adhesively couple the inverted component 400 with the coupling region 550 during the second convection reflow stage. The inverted component 400 thereby is inhibited from separating from the double-sided printed circuit board 500 and/or from becoming substantially misaligned with the relevant mounting surfaces 520. Thus, when the solder connections 600 cool and again solidify after the second convection reflow stage, the component 400 remains properly assembled onto the double-sided printed circuit board 500.

Figure 7:
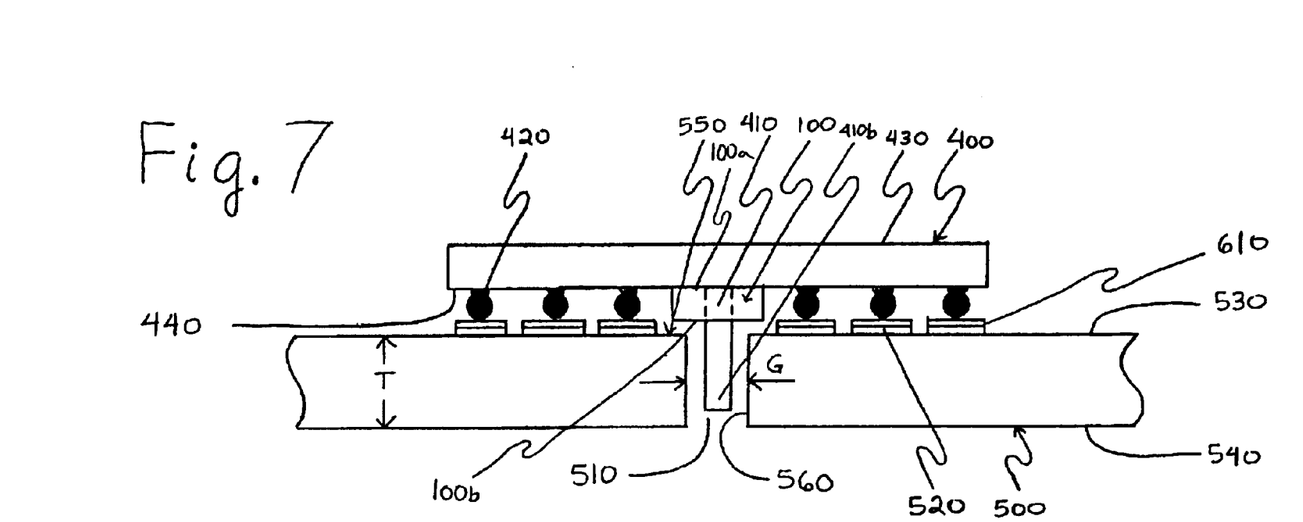
FIG. 7 is an illustration of another preferred embodiment of a retainer to substantially maintain the placement of components assembled onto a printed circuit board in accordance with the present invention.

Those skilled in the art will appreciate that the retainer 100 of the present invention is compatible with a component 400 having a coupling member, more specifically a post 410, that is configured to extend into, and to be received by, an opening 510 formed in a double-sided printed circuit board 500 as shown in FIG. 7. As was discussed in more detail above, the retainer 100 is formed from a pre-cured epoxy material (not shown) and can be formed with any size and shape. Having a proximal end region 100*a* and a distal end region 100*b*, the retainer 100 is configured to couple with the component 400 via, for example, the post 410 as was discussed in more detail above. The post 410 extends from a component package 430 of the component 400 and includes a distal end region 410*b*. A length D (shown in FIG. 3) of the post 410 can be greater than or substantially equal to a pre-reflow standoff distance F as was discussed in more detail above with reference to FIG. 3. The retainer 100 is configured to receive the distal end region 410*b* of the post 410. A channel 110 (shown in FIG. 1*b*) can be preformed in the epoxy material of the retainer 100 and/or can be formed in the epoxy material by the distal end region 410*b* as the distal end region 410*b* is being received. The channel 110 further is configured to continue to receive the distal end region 410*b* until the proximal end region 100*a* of the retainer 100 becomes substantially adjacent to, or comes into contact with, a surface 440 of the component package 430. When the proximal end region 100*a* is substantially adjacent to, or is in contact with, the surface 440 of the component package 430, the retainer 100 preferably is substantially flat.

Upon being coupled with the retainer 100, the component 400 is positioned onto one or more relevant mounting surfaces 520 on, for example, a primary side 530 of the double-sided printed circuit board 500 as was discussed in more detail above. The component 400, and the additional components, can be positioned by any manner known in the art, such as a pick-and-place machine (not shown). If the component 400 and the additional components, if any, are to be assembled onto the primary side 530 via solder reflow, for example, solder paste 610 is applied to each relevant mounting surface 520 for the component 400 and each relevant mounting surface for the additional components. The component 400 and the additional components then each are respectively positioned onto the relevant mounting surfaces and held substantially in place by the solder paste 610 and/or gravity. When the component 400 is properly positioned, the post 410*b* preferably is configured to be substantially axially aligned with, and substantially completely or partially received within, the opening 510 in the double-sided printed circuit board 500. The retainer 100 also is configured to be substantially in axial alignment with, and to extend substantially toward, a coupling region 550. As was discussed in more detail above, the coupling region 500 is formed on the primary side 530 of the double-sided printed circuit board 500 and is configured to receive epoxy material flowing from the retainer 100 when the epoxy material transitions into a semi-liquid state.

Being disposed substantially within the coupling region 550, the opening 510 can comprise any type of opening, such as a via and/or a plated or non-plated through-hole, and can extend substantially completely or partially through the double-sided printed circuit board 500. The opening 510 can be formed with any size and shape that is greater than a cross-section E" of the distal end region 410*b*. For example, if the double-sided printed circuit board 500 has a thickness T of approximately 1.5 mm, the distal end region 410*b* can have a cross-section E" (shown in FIG. 3) of approximately 2.3 mm, and the opening 510 can have a diameter G substantially equal to 2.6 mm. The post 410 and the retainer 100 are preferably substantially axially aligned with the opening 510 when the component 400 is properly positioned onto the primary side 530. Although the post 410 is configured to extend, substantially completely or partially, through the double-sided printed circuit board 500 via the opening 510, the distal end region 410*b* preferably is disposed substantially within the opening 510 when the component 400 is positioned onto the primary side 530.

The component 400 can be assembled onto the primary side 530 via any manner known in the relevant art, such as convection reflow, as was discussed in more detail above. As the double-sided printed circuit board 500, along with the component 400, the retainer 100, and any additional components (not shown), begins to heat, the ambient temperature surrounding the double-sided printed circuit board 500 approaches the typical solder reflow temperature. Being formed from the epoxy material with a liquefaction temperature that is less than or substantially equal to the typical solder reflow temperatures, the retainer 100 is configured to transition from a solid state to the semi-liquid state before or as the solder paste 610 begins to liquefy. Upon transitioning into the semi-liquid state, the liquefied epoxy from the distal end region 100b of the retainer 100 is configured to viscously flow, via gravity, onto, and adhere with, the coupling region 550 of the primary side 530. Guided by a surface tension of the liquefied epoxy material and/or the post 410, some of the liquefied epoxy material further is configured to flow into the opening and adhere with one or more inner surfaces 560 defining the opening 510. The post 410 and the inner surfaces 560 provide additional adhesion surface area for the liquefied epoxy material and act to inhibit the liquefied epoxy material from extending or flowing beyond the coupling region 550. While remaining coupled with the post 410, the liquefied epoxy material of the retainer 100 is configured to viscously flow onto and adhere with the coupling region 550 and the opening 510, adhesively coupling the component 400 with the double-sided printed circuit board 500.

As the ambient temperature approaches the typical solder reflow temperature, the solder paste 610 begins to liquefy. As was discussed in more detail above, the liquefied solder paste 610 forms solder connections 600 (shown in FIG. 6), coupling each of the electrical connections 420 with the one or more relevant mounting surfaces 520. As convection reflow continues, the ambient temperature remains substantially at or above the typical solder reflow temperature, which substantially corresponds with a curing temperature of the epoxy material of the retainer 100. When the ambient temperature is greater than or substantially equal to the curing temperature, the liquefied epoxy material cures in the shape produced in the semi-liquid state as was discussed in more detail above. By adhesively coupling the double-sided printed circuit board 500 with the component 400, the cured epoxy material of the retainer 100 is configured to substantially maintain the proper position of the component 400 even as the solder connections 600 remain liquefied during convection reflow. After convection reflow, the solder connections 600 cool and solidify, and the component 400 is properly assembled onto the double-sided printed circuit board 500. When the double-sided printed circuit board 500 subsequently is inverted and undergoes a second solder reflow stage, therefore, the cured epoxy material is configured to substantially maintain the position of the component 400 on the one or more relevant mounting surfaces 520 even if some or all of the solder connections 600 liquefy.

Figure 8:
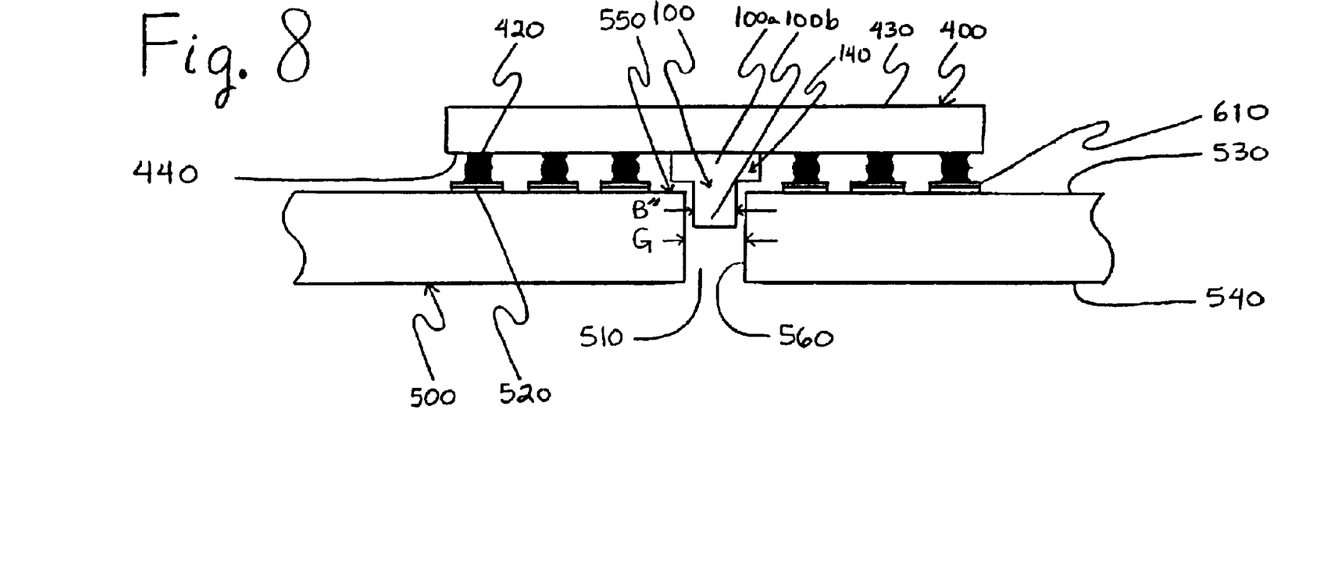
FIG. 8 is an illustration of another preferred embodiment of a retainer to substantially maintain the placement of components assembled onto a printed circuit board in accordance with the present invention.

Those skilled in the art also will appreciate that the retainer 100 of the present invention can comprise an extended epoxy body 140 as illustrated in FIG. 8. The extended epoxy body 140 is configured to extend into, and to be received by, an opening 510 formed in a double-sided printed circuit board 500. As was discussed in more detail above, the retainer 100 is formed from a pre-cured epoxy material (not shown) and can be formed with any size and shape. The retainer 100, including a proximal end region 100a and a distal end region 100b, is configured to couple with the component 400 via the proximal end region 100a. The retainer 100 is configured to couple with the component 400 in any manner, for example, adhesively and/or via a coupling member, more specifically a post 410 (shown in FIG. 7), extending from a component package 430 of the component 400, as was discussed in more detail above. If the retainer 100 is coupled with the component 400 via the post 410, for example, a distal end region 410b (shown in FIG. 7) of the post 410 can be disposed substantially within or extend from the epoxy body 140. The proximal end region 100a preferably is positioned to be substantially adjacent to, or in contact with, a surface 440 of the component package 430.

Upon being coupled with the retainer 100, the component 400 is positioned onto one or more relevant mounting surfaces 520 on, for example, a primary side 530 of the double-sided printed circuit board 500 by any manner known in the art, as was discussed in more detail above. If the component 400, and any additional components, is to be assembled onto the primary side 530 via solder reflow, for example, solder paste 610 is applied to each relevant mounting surface 520 for the component 400 and each relevant mounting surface for the additional components, if any. The component 400 and the additional components then each are respectively positioned onto the relevant mounting surfaces and held substantially in place by the solder paste 610 and/or gravity. When the component 400 is properly positioned, the distal end region 100b of the retainer 100 is configured to be substantially in axial alignment with, and to extend substantially toward, a coupling region 550. The coupling region 500 is formed on the primary side 530 of the double-sided printed circuit board 500 and is configured to receive epoxy material flowing from the retainer 100 when the epoxy material transitions into a semi-liquid state as was discussed in more detail above.

The opening 510 is disposed substantially within the coupling region 550. As was discussed in more detail above, the opening 510 can comprise any type of opening, such as a via and/or a plated or non-plated through-hole, and preferably extends through the double-sided printed circuit board 500. The opening 510 can be formed with any size and shape and preferably has a diameter G that is greater than a cross-section B" of the distal end region 100b. The distal end region 100b is substantially axially aligned with the opening 510 when the component 400 is properly positioned onto the primary side 530. Although configured to extend, substantially completely or partially, through the double-sided printed circuit board 500 via the opening 510, the distal end region 100b preferably is disposed substantially within the opening 510 when the component 400 is positioned onto the primary side 530. The retainer 100, when received within the opening 510, can be configured to be substantially adjacent to, or in contact with, one or more inner surfaces 560 defining the opening 510.

The component 400 can be assembled onto the primary side 530 via any manner known in the relevant art, such as convection reflow, as was discussed in more detail above. As the double-sided printed circuit board 500, along with the component 400, the retainer 100, and any additional components (not shown), begins to heat, the ambient temperature surrounding the double-sided printed circuit board 500 approaches the typical solder reflow temperature. Being formed from the epoxy material with a liquefaction temperature that is less than or substantially equal to the typical solder reflow temperatures, the retainer 100 is configured to transition from a solid state to the semi-liquid state before or as the solder paste 610 begins to liquefy. Upon transitioning into the semi-liquid state, the liquefied epoxy material of the distal end region 100b is configured to flow onto, and adhere with, one or more of the inner surfaces 560 defining the opening 510. The inner surfaces 560 provide an adhesion surface area for the distal end region 100b and inhibit the liquefied epoxy material from extending or flowing beyond the opening 510 or the coupling region 550. Some of the liquefied epoxy material further is configured to flow onto, and adhere with, the coupling region 550 on the primary side 530. The proximal end region 100a of the retainer 100 remains coupled with the component 400, and the distal end region 100b is configured to flow onto and adhere with the coupling region 550 and the opening 510, adhesively coupling the component 400 with the double-sided printed circuit board 500.

As was discussed in more detail above, the solder paste 610 begins to liquefy as the ambient temperature approaches the typical solder reflow temperature. The liquefied solder paste 610 forms solder connections 600 (shown in FIG. 6), coupling the electrical connections 420 with the relevant mounting surfaces 520. As convection reflow continues, the ambient temperature remains substantially at or above the typical solder reflow temperature, which substantially corresponds with a curing temperature of the epoxy material of the retainer 100. When the ambient temperature is greater than or substantially equal to the curing temperature, the liquefied epoxy material cures in the shape produced in the semi-liquid state. The double-sided printed circuit board 500 thereby is coupled with the component 400, and the cured epoxy material of the retainer 100 is configured to substantially maintain the proper position of the component 400 even as the solder connections 600 remain liquefied during convection reflow. After convection reflow, the solder connections 600 cool and solidify, and the component 400 is properly assembled onto the double-sided printed circuit board 500. When the double-sided printed circuit board 500 subsequently is inverted and undergoes a second solder reflow stage, therefore, the retainer 100 is configured to substantially maintain the position of the component 400 on the relevant mounting surfaces 520 even if some or all of the solder connections 600 liquefy as was discussed in more detail above.

It will be further appreciated that, if a component 400 is too large and/or too heavy to be sufficiently supported by a single retainer 100, a plurality of retainers 100 can be coupled with the component 400. Each of the plurality of retainers 100 can be formed on or coupled with the component 400 in any manner as discussed in more detail above. The plurality of retainers 100 each can be formed from substantially the same epoxy material and/or a different epoxy material and can be coupled with the component 400 in any manner, such as adhesively or via a coupling member, more specifically a post 410, as was described in more detail above. The double-sided printed circuit board 500 can include one or more coupling regions 550, each being associated with one of the plurality of retainers 100. The plurality of retainers 100 can be arranged in any manner and preferably are substantially equally distributed such that the mass of the component 400 is substantially equally distributed among the plurality of retainers 100. For example, if the component 400 is manufactured in a component package 430 that is substantially rectangular in shape, one of the plurality of retainers 100 can be coupled with each corner of the component package 430. Upon being exposed to a temperature substantially equal to a liquefaction temperature of the epoxy material, at least one, preferably all, of the plurality of retainers 100 each is configured to flow onto and adhere with one of the relevant coupling regions 550. The liquefied epoxy of the plurality of retainers 100 each further is configured to cure when exposed to a temperature greater than or substantially equal to a curing temperature of the epoxy material. The component 400 thereby is adhesively coupled with the double-sided printed circuit board 500 via the plurality of retainers 100. Comprising cured epoxy, the plurality of retainers 100 each is configured to substantially maintain the proper position of the component 400 when the double-sided printed circuit board 500 is inverted and subjected to a second solder reflow stage.

In operation, a retainer 100 is formed from a pre-cured epoxy material (not shown) in any size and shape as shown in FIGS. 1a and 1b. Although formable from the epoxy material as a substantially-solid body 105a, the retainer 100 preferably comprises as a porous body 105b, including one or more internal surfaces 120 defining a channel 110 as was discussed in more detail above with reference to FIG. 1b. The channel 110 can be formed with any size and shape and can include one or more engaging members 130. The engaging members 130 each are formed on, or coupled with, one or more of the internal surfaces 120 defining the channel 110 and extend, preferably radially, into the channel 110 from the internal surfaces 120. To configure the engaging members 130 to be substantially opposing, the channel 110 preferably is formed with a cross-section C substantially in the shape of a cross as illustrated in FIG. 1b. The retainer 100 further includes, or can be formed with, a proximal end region 100a and a distal end region 100b as shown in FIG. 3. The proximal end region 100a preferably is substantially opposite the distal end region 100b and is coupled with, or communicates with, the distal end region 100b via the channel 110.

As shown in FIG. 4, the retainer 100 is coupled with a component 400 in any manner known in the art, such as adhesively or frictionally, as was discussed in more detail above. The component 400 can comprise any type of electrical and/or electronic component and includes one or more electrical connections 420 that are electrically isolated and supported by a component package 430. The retainer 100 preferably is coupled with a surface 440 of the component package 430 via a coupling member, more specifically a post, as was previously discussed in more detail above. The post 410 can be formed from any type of material, such as plastic, ceramic, or metal, that is well-known in the art and is coupled with, and extends from, the surface 440 of the component package 430. Having a proximal end region 410a and a distal end region 410b, the post 410 is coupled with the component package 430 via the proximal end region 410a. The post 410 can be coupled with the component package 430 in any manner known in the art, including via an adhesive, clamps, and/or fasteners. The retainer 100 and/or the post 410 can be coupled with the component 400 at any time at any time prior to assembly of the component 400 onto the double-sided printed circuit board 500, such as during a separate manufacturing stage or during pre-assembly preparation of the component 400.

When positioned on, and coupled with, the component 400 via the post 410, for example, the channel 110 receives the distal end region 410b of the post 410. The channel 110 continues to receive the distal end region 410b until the proximal end region 100a of the retainer 100 becomes substantially adjacent to, or comes into contact with, the surface 440 of the component package 430 as shown in FIG. 3. When the proximal end region 100a is substantially adjacent to, or in contact with, the surface 440, the retainer 100 preferably is substantially flat. The distal end region 410b of the post 410 can be disposed substantially within or extend from the distal end region 100b of the retainer 100. The internal surfaces 120 and/or the engaging members 130 of the channel 110 engage the distal end 410b in any manner, such as frictionally and/or adhesively, maintaining the retainer 100 substantially adjacent to the surface 440 of the component package 430. The retainer 100 can be further secured to the surface 440, for example, adhesively via the epoxy material of the proximal end region 100a or an adhesive.

Returning to FIG. 4, upon being coupled with the retainer 100, the component 400 is positioned onto the relevant mounting surfaces 520 on one side, such as, for example, a primary side 530, of the double-sided printed circuit board 500 as was discussed in more detail above. The component 400, along with any additional components (not shown), can be positioned onto the primary side 530 in any manner known in the art, such as a pick-and-place machine (not shown). The component 400 and any additional components, for example, can be assembled onto the primary side 530 via solder reflow. If solder reflow is to be used, solder paste 610 is applied to each relevant mounting surface 520 and each relevant mounting surface for the additional components prior to placement. The component 400 and the additional components each is respectively held substantially in place by the solder paste 610 and/or gravity. When the component 400 is properly positioned, the retainer 100 is substantially axially aligned with, and extends substantially toward, a coupling region 550. The coupling region 550 is formed on the primary side 530 and defines a target region of the double-sided printed circuit board 500 for adhesively coupling with the epoxy material of the retainer 100. Being formed with any size and shape, the coupling region 550 can include an opening 510, which preferably is formed completely through the double-sided printed circuit board 500. The opening 510 preferably is substantially in axial alignment with, and is configured to receive, in whole or in part, the distal end region 410b of the post 410 and/or the distal end region 100b of the retainer 100.

Once positioned, the component 400 and the additional components can be assembled onto the primary side 530 via any manner known in the art as was discussed in detail above. For example, convection reflow can be used to assemble the component 400 and the additional components. During convection reflow, the double-sided printed circuit board 500, along with the component 400, the retainer 100, and the additional components, begins to heat. The ambient temperature surrounding the double-sided printed circuit board 500 increases and approaches the typical solder reflow temperature. Being formed from the epoxy material with a liquefaction temperature that is less than or substantially the typical solder reflow temperatures, the retainer 100 transitions from a solid state to a semi-liquid state before or as the solder paste 610 begins to liquefy as shown in FIG. 5. Upon transitioning into the semi-liquid state, the liquefied epoxy material of the distal end region 100b viscously flows via, for example, gravity substantially toward the coupling region 550 and the opening 510, guided, for example, by a surface tension of the liquefied epoxy material and/or the post 410. The liquefied epoxy material of the distal end region 100b is received upon, and adheres with, the coupling region 550. Continuing to viscously flow, a portion of the liquefied epoxy material can be received within the opening 510 and can adhere with the inner surfaces 560 defining the opening 510. The proximal end region 100a and the channel 100 of the retainer 100 also remain coupled with the component 400 and the post 410, adhesively coupling the component 400 with the double-sided printed circuit board 500.

As the ambient temperature approaches the typical solder reflow temperature, the solder paste 610 begins to liquefy. The liquefied epoxy material, being in the semi-liquid state, complies as a surface tension of the liquefied solder paste 610 enables the component 400 to substantially align with, and to couple with, the relevant mounting surfaces 520 on the primary side 530. Once the component 400 is substantially aligned with each of the relevant mounting surfaces 520, the liquefied solder paste 610 forms the solder connections 600, coupling each of the electrical connections 420 with the one or more relevant mounting surfaces 520, as shown in FIG. 6. Substantially at or above the typical solder reflow temperature, the ambient temperature surrounding the double-sided printed circuit board 500 substantially reaches a curing temperature of the epoxy material of the retainer 100. When the ambient temperature is greater than or substantially equal to the curing temperature, the liquefied epoxy material cures in the shape produced in the semi-liquid state. By adhesively coupling the double-sided printed circuit board 500 with the component 400, the retainer 100 substantially maintains the proper position of the component 400 even as the solder connections 600 remain liquefied during the convection reflow stage. After the convection reflow stage, the solder connections 600 cool and solidify, and the component 400 is properly assembled onto the primary side 530 of the double-sided printed circuit board 500.

After the component 400 and the additional components are assembled onto the primary side 530, the double-sided printed circuit board 500 can be inverted to facilitate the positioning of one or more other components (not shown) onto the secondary side 540. The other components each are positioned onto one or more relevant mounting surfaces (not shown) on the secondary side 540 by any manner known in the art as was previously discussed in more detail above. For example, solder paste (not shown) can be applied to each of the relevant mounting surfaces, and the other components can be positioned onto the relevant mounting surfaces and held in place by the solder paste and/or gravity. Once positioned, the other components are assembled onto the secondary side 540 by any manner known in the art, such as a second convection reflow stage, as was previously discussed in more detail above. During the second convection reflow stage, the double-sided printed circuit board 500, along with the inverted component 400, the retainer 100, and the other components, begins to heat. To reflow the solder paste associated with the other components, the ambient temperature surrounding the double-sided printed circuit board 500 approaches the typical solder reflow temperature at which some or all of the solder connections 600 of the inverted component 400 can liquefy.

Being formed from a cured epoxy material that can withstand decomposition and remain functionally stable at temperatures exceeding the typical solder reflow temperatures, the retainer 100 remains functionally stable during the second convection reflow stage. Upon entering the cured state, the epoxy material inhibits the retainer 100 from deforming or softening due to heat exposure. The retainer 100 continues to adhere the component 400, as inverted, with the primary side 530 during the second convection reflow stage. The inverted component 400 thereby is inhibited from separating from the double-sided printed circuit board 500 and from becoming substantially misaligned with the relevant mounting surfaces 520, during the second convection reflow stage. Thus, when the solder connections 600 again cool and solidify after the second convection reflow stage, the inverted component 400 remains properly assembled onto the double-sided printed circuit board 500. The other components therefore are assembled onto the secondary side 540, and the component 400, as supported by the retainer 100 during the second reflow stage, is properly assembled onto the primary side 530.

While the invention is susceptible to various modifications and alternative forms, specific examples thereof have been shown by way of example in the drawings and are herein described in detail. It should be understood, however, that the invention is not to be limited to the particular forms or methods disclosed, but to the contrary, the invention is to cover all modifications, equivalents, and alternatives falling within the spirit and scope of the appended claims.

What is claimed is:

1. A retainer for printed circuit board assemblies, comprising:
   an adhesive body formed from an epoxy material, said adhesive body having a solid state and a semi-liquid state;
   a proximal end region, said proximal end region being formed on said adhesive body and being configured to couple with a component positioned on a first printed circuit board via a post coupled to the component, when said adhesive body is in said solid state; and
   a distal end region, said distal end region being formed on said adhesive body and being configured to adhesively couple to a coupling region of a second printed circuit board when said adhesive body is in said semi-liquid state.

2. The retainer of claim 1, wherein said proximal end region is configured to remain coupled with said component when said adhesive body is in said semi-liquid state.

3. The retainer of claim 1, wherein said adhesive body is configured to transition from said solid state to said semi-liquid state at a temperature that is less than or substantially equal to a typical solder reflow temperature.

4. The retainer of claim 1, wherein said adhesive body has a cured state.

5. The retainer of claim 4, wherein said adhesive body is configured to transition from said semi-liquid state to said cured state at a temperature that is greater than or substantially equal to a typical solder reflow temperature.

6. The retainer of claim 4, wherein said proximal end region is configured to remain coupled with said component when said adhesive body is in said cured state, and said distal end region is configured to remain adhesively coupled to the coupling region of the second printed circuit board when said adhesive body is in said cured state.

7. The retainer of claim 4, wherein said adhesive body is configured to be functionally stable at a temperature that is greater than or substantially equal to a typical solder reflow temperature when said adhesive body is in said cured state.

8. The retainer of claim 1, wherein said adhesive body includes a channel, said channel being formed in said adhesive body and being configured to receive said post.

9. The retainer of claim 8, wherein said channel is configured to engage said post.

10. The retainer of claim 8, wherein at least one engaging member is formed on an internal surface defining said channel, said at least one engaging member each extending into said channel from said internal surface and being configured to engage said coupling member.

11. The retainer of claim 8, wherein said channel is preformed in said adhesive body.

12. The retainer of claim 1 wherein said post is configured to extend through said adhesive body.

13. An epoxy washer, comprising:
   a channel, said channel being substantially centrally formed in said epoxy washer and being configured to engage a post extending from a component of a first printed circuit board when said epoxy washer is in a solid state; and
   a distal end region, said distal end region being formed on said epoxy washer, being coupled with said channel, and being configured to adhesively couple to a coupling region of a second printed circuit board when said epoxy washer is in a semi-liquid state.

14. The epoxy washer of claim 13, wherein said channel is configured to remain engaged with said component when said epoxy washer is in said semi-liquid state.

15. The epoxy washer of claim 13, wherein said epoxy washer is configured to transition from said solid state to said semi-liquid state at a temperature that is less than or substantially equal to a typical solder reflow temperature.

16. The epoxy washer of claim 13, wherein said epoxy washer is configured to transition from said semi-liquid state to said cured state at a temperature that is greater than or substantially equal to a typical solder reflow temperature.

17. The epoxy washer of claim 13, wherein said channel is configured to remain coupled with said post when said epoxy washer is in said cured state, and said distal end region is configured to remain adhesively engaged with said second printed circuit board when said epoxy washer is in said cured state.

18. The epoxy washer of claim 13, wherein said epoxy washer is configured to be functionally stable at a temperature that is greater than or substantially equal to a typical solder reflow temperature when said epoxy washer is in said cured state.

* * * * *